US007183775B2

(12) United States Patent
Durham et al.

(10) Patent No.: US 7,183,775 B2
(45) Date of Patent: Feb. 27, 2007

(54) SYSTEMS AND METHODS FOR DETERMINING WHETHER A HEAT SINK IS INSTALLED

(75) Inventors: Michael R. Durham, Tomball, TX (US); Stephen J. Higham, Houston, TX (US); Mark D. Tupa, Cypress, TX (US); Jim Paikattu, Missour City, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 533 days.

(21) Appl. No.: 10/702,357

(22) Filed: Nov. 6, 2003

(65) Prior Publication Data

US 2005/0099172 A1 May 12, 2005

(51) Int. Cl.
*G01R 31/02* (2006.01)
*G01R 31/04* (2006.01)

(52) U.S. Cl. ....................... 324/537; 324/538; 324/761

(58) Field of Classification Search .................. 324/66, 324/755, 537, 760, 538
See application file for complete search history.

(56) References Cited

U.S. PATENT DOCUMENTS

| | | | | |
|---|---|---|---|---|
| 5,307,236 | A * | 4/1994 | Rio et al. | 361/720 |
| 5,625,292 | A * | 4/1997 | Crook et al. | 324/538 |
| 6,097,203 | A * | 8/2000 | Parker et al. | 324/763 |
| 6,137,298 | A * | 10/2000 | Binns | 324/755 |
| 6,496,010 | B1 * | 12/2002 | Myers et al. | 324/500 |
| 6,683,449 | B1 * | 1/2004 | Bell et al. | 324/158.1 |
| 6,703,841 | B2 * | 3/2004 | Scilla | 324/537 |
| 2006/0103016 | A1 * | 5/2006 | Tan et al. | 257/720 |

* cited by examiner

*Primary Examiner*—Anjan Deb

(57) ABSTRACT

Disclosed are systems and methods for determining when a heat sink is installed. In one embodiment, a system comprises an electrically-conductive heat sink retainer clip that is adapted to maintain contact between a heat sink and a heat-producing component, the retainer clip further being adapted to electrically connect to ground, and a heat sink detection circuit adapted to provide voltage to the retainer clip, the heat sink detection circuit being configured to provide a logic value that indicates one of presence or absence of a heat sink.

25 Claims, 4 Drawing Sheets

SYSTEMS AND METHODS FOR DETERMINING WHETHER A HEAT SINK IS INSTALLED

BACKGROUND

Computing devices such as personal computers (PCs) typically include one or more printed circuit boards (PCBs) on which various components are mounted to form printed circuit assemblies (PCAs). Such components include those that generate heat during their operation. One type of component that often generates large quantities of heat is a microchip, such as a microprocessor.

Due to the great heat generated by some components, heat sinks are sometimes employed to remove heat from the components and transfer that heat to the ambient air that surrounds the components. For example, it is now common to mount heat sinks to microprocessors to reduce the heat of the microprocessors during their operation. In some cases, a manufacturing error that results in the absence of such a heat sink can cause operational errors to occur due to overheating of the component. Therefore, it may be important to ensure that a given heat sink is present.

Due to the importance of such heat sinks, it is desirable to inspect a computing device during manufacturing to verify that the heat sink(s) of the device is/are present. Currently, such inspection is typically accomplished visually. In the case of a PC, for example, the presence of a given heat sink is manually confirmed by a human being before the PC outer housing is installed. If inspection is desired after that point, the outer housing must be removed before such inspection can take place.

It would be desirable to have a system and method for determining whether a heat sink is installed that does not require visual inspection.

SUMMARY

Disclosed are systems and methods for determining when a heat sink is installed. In one embodiment, a system comprises an electrically-conductive heat sink retainer clip that is adapted to maintain contact between a heat sink and a heat-producing component, the retainer clip further being adapted to electrically connect to ground, and a heat sink detection circuit adapted to provide voltage to the retainer clip, the heat sink detection circuit being configured to provide a logic value that indicates one of presence or absence of a heat sink.

In one embodiment, a method comprises providing a voltage to a first mounting post that is adapted to receive a heat sink retainer clip that is adapted to hold a heat sink against a heat-producing element, connecting a second mounting post to ground, the second mounting post also being adapted to receive the heat sink retainer clip, and producing a logic value that indicates whether the retainer clip is or is not connected to both of the mounting posts.

BRIEF DESCRIPTION OF THE DRAWINGS

The disclosed systems and methods can be better understood with reference to the following drawings. The components in the drawings are not necessarily to scale.

DETAILED DESCRIPTION

Disclosed are systems and methods for determining whether a heat sink is installed so that overheating of a heat-producing component of a computing device can be avoided. As is described in the following, the systems and methods, at least in some embodiments, employ a heat sink detection circuit that is in electrical communication with a heat sink retainer clip. When the heat sink retainer clip is properly mounted, the heat sink can be assumed to be present and a first logic value is observed from the heat sink detection circuit. When the heat sink retainer clip is not properly mounted, indicating that the heat sink is absent, a second logic value is observed from the heat sink detection circuit. In some embodiments, the logic values can be observed by connecting to a pin that is accessible from the exterior of the computing device. In such a case, the presence or absence of the heat sink can be determined without the need for visual inspection. In an alternative case, the pin could be used to generate a hardware and/or software interrupt to perform an action. By way of example, that action could comprise one or more of informing the user via a display, indicating an error visually or audibly outside of the computing device using a light source or speaker, and the like.

Figure 1:
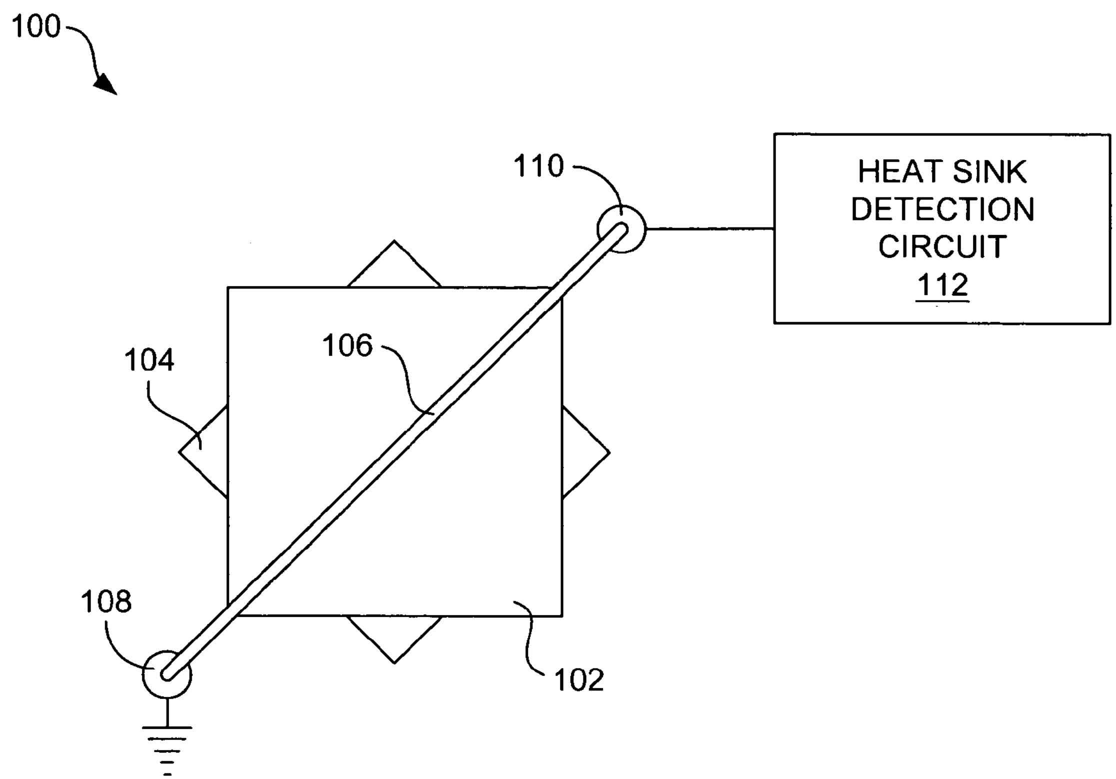
FIG. 1 is a schematic view of an embodiment of a system for determining whether a heat sink is installed.

Referring now in more detail to the drawings, in which like numerals indicate corresponding parts throughout the several views, FIG. 1 illustrates a system 100 in which a heat sink 102 is mounted to a heat-producing component 104. A more detailed discussion of the heat sink 102 and the heat-producing component 104 is provided in relation to the embodiment shown in FIGS. 2A and 2B. In general, however, the heat-producing component 104 comprises a component that is mounted to a surface of a printed circuit board (PCB) (not shown) that comprises part of a printed circuit assembly (PCA), and the heat sink 102 comprises a thermally-conductive mass of material, such as a mass of metal.

As indicated in FIG. 1, the heat sink 102 contacts a heat sink retainer clip 106 that, as is described in greater detail below, may urge the heat sink into firm contact with the heat-producing component 104 to promote the transfer of heat from the component to the heat sink. Although a single retainer clip 106 is illustrated in FIG. 1, multiple electrically-linked retainer clips of various configurations could be used, if desired. Irrespective of the particular configuration of the retainer clip 106, the clip is constructed of an electrically conductive material, such as a metal. The retainer clip 106 is connected to mounting posts 108, 110 that, in the embodiment of FIG. 1, are positioned adjacent opposed corners of the heat sink 102. The mounting posts 108, 110 comprise electrically conductive elements (discussed below) that contact the retainer clip 106 such that the retainer clip and the mounting posts are in electrical communication with each other. By way of example, the mounting posts 108, 110 are mounted to the same structure (e.g., PCB) to which the heat-producing component 104 is mounted.

Figure 3:
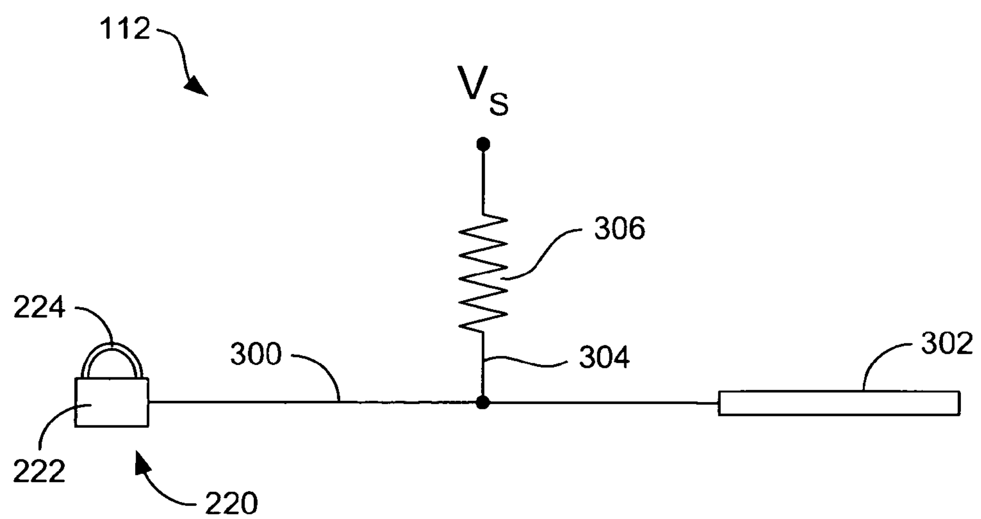
FIG. 3 is schematic view of an embodiment of a heat sink detection circuit shown in FIG. 1.

As shown in FIG. 1, a first mounting post 108 is connected to ground (e.g., via a PCB), while a second mounting post 110 is connected to a heat sink detection circuit 112. A particular embodiment for the heat sink detection circuit 112 is illustrated in FIG. 3. Generally speaking, however, the heat sink detection circuit 112 is configured to generate a first logic signal when the heat sink 102 is in place (as indicated by proper mounting of the retaining clip 106) and a second logic signal when the heat sink is not in place (as indicated by absence or improper mounting of the retaining clip). As noted above, such a signal or value may be obtainable from the exterior of the computing device in which the detection circuit is used.

Figure 2A:
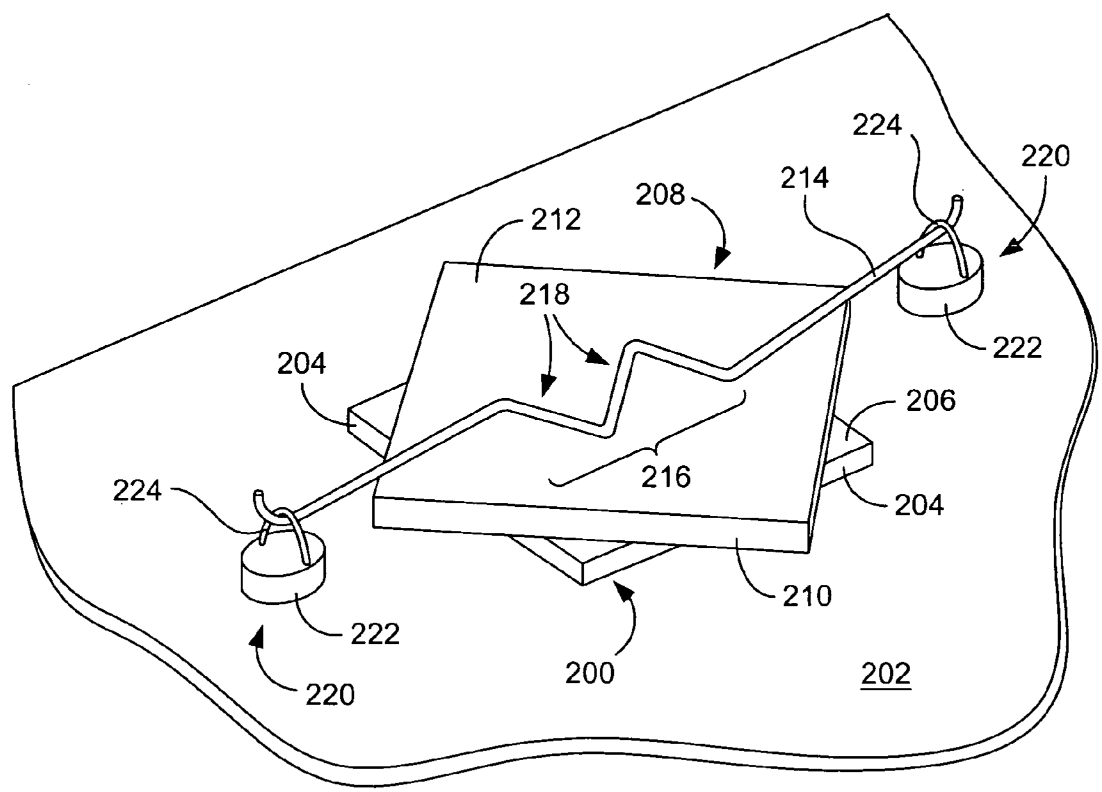
FIG. 2A is a perspective view of an embodiment of a mounting scheme in which a heat sink is mounted to a heat-producing component that, in turn, is mounted to a printed circuit board.
Figure 2B:
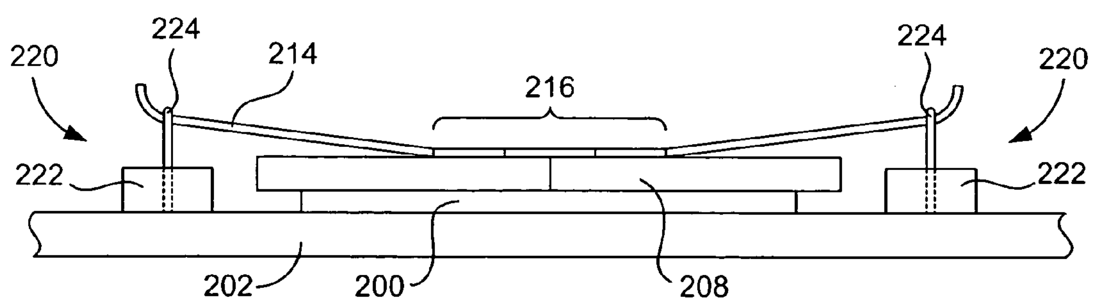
FIG. 2B is a side view of the mounting scheme shown in FIG. 2A.

FIGS. 2A and 2B illustrate an example embodiment for a heat sink mounted to a heat-producing component. In this embodiment, a heat-producing component 200, in the form of a microchip, is mounted to a PCB 202 (only a portion thereof depicted in FIGS. 2A and 2B). As shown in FIG. 2A, the heat-producing component 200 is thin and generally rectangular so as to have four edges 204, a top side 206, and a bottom side (in contact with the PCB 202 and not visible in the figures).

Mounted on top of the heat-producing component 200 is a heat sink 208 that, like the heat-producing component 200, is thin and generally rectangular so as to include four sides 210, a top surface 212, and a bottom surface (not visible in FIG. 2A or 2B). As shown in FIG. 2A, the heat sink 208 may be shifted approximately 45° relative to the heat-producing component 200 such that all corners of the heat-producing component 200 are visible when viewed from above. As described above, the heat sink 208 is composed of a thermally conductive material, such as a metal. By way of example, the heat sink 208 may be composed of aluminum. Although not indicated in FIG. 2A or 2B, the heat sink 208 may comprise one or more heat dissipation features, such as fins, that aid in transferring heat to the ambient air that surrounds the heat sink and the heat-producing component 200. It is noted that many different materials and configurations may be used to form the heat sink. The choice of material and/or configuration is not important to the operation of the disclosed systems and methods.

In contact with the heat sink 200 is a heat sink retainer clip 214. In the embodiment shown in FIGS. 2A and 2B, the retainer clip 214 contacts the top surface 212 of the heat sink 208. The heat sink retainer clip 214 is composed of an electrically-conductive material, such as a metal. By way of example, the retainer clip 214 comprises a steel spring. In cases in which the retainer clip 214 is formed as a spring, the retainer clip applies a downward force against the top surface 212 of the heat sink 208 so as to urge the heat sink into firm contact with the heat-producing component 200. In the example embodiment of FIGS. 2A and 2B, such contact occurs along a contact portion 216 of the retainer clip 214 (see FIG. 2B) which includes lateral portions 218 (see FIG. 2A) that maintain the heat sink 208 in position.

The heat sink retainer clip 214 is held in place by mounting posts 220 that are mounted to the PCB 202. The mounting posts 220 include base portions 222, which secure the posts to the PCB 202, and loop portions 224 that the retainer clip 214 hooks. At least the loop portions 224 are composed of an electrically-conductive material, such as steel, so that the retainer clip 214 and the loop portions are in electrical communication with each other. The loop portions 224 extend down to the PCB 202 (see FIG. 2B) so that the mounting posts 220 may connect to other components. As described above, one of the posts 220 is connected to ground and another is connected to a heat sink detection circuit.

An example embodiment for a heat sink detection circuit 112 is illustrated in FIG. 3. The heat sink detection circuit 112 may comprise part of a PCB (e.g., PCB 202 shown in FIGS. 2A and 2B) to which the heat-producing component is mounted. As indicated in FIG. 3, the heat sink detection circuit 112 is connected to a mounting post 220 shown in FIGS. 2A and 2B. The detection circuit 112 includes a conductor line 300 that is in electrical communication with the mounting post 220 and, more particularly, with the loop portion 224 of that mounting post. Electrically connected to the conductor line 300 is a pin 302 that, in some embodiments, is accessible from outside of a computing device in which the heat sink detection circuit 112 is provided. By way of example, the pin 302 comprises a pin that extends from a PCB in which the detection circuit 112 is formed that can be accessed from a rear of the computing device (e.g., in a connection panel).

Connected to the conductor line 300 is another conductor line 304 that includes a resistor 306. By way of example, the resistor 306 provides a resistance of approximately 2,200 Ohms (Ω) to 10,000 Ω. The conductor line 304 is also connected to a source voltage, $V_S$, which, for example, is provided by a power supply of the computing device in which the detection circuit 112 is provided. By way of example, $V_S$ is approximately 3 volts (V) to 12 V, for example 5 V.

Figure 4:
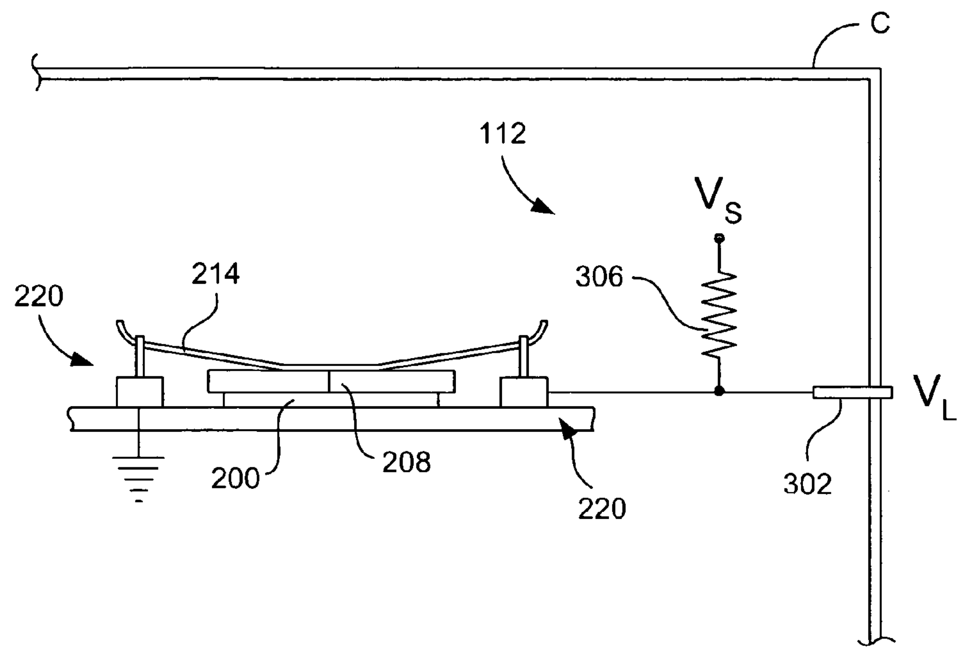
FIG. 4 illustrates an embodiment of detection of the presence of a heat sink using the embodiments of FIGS. 2–3.
Figure 5:
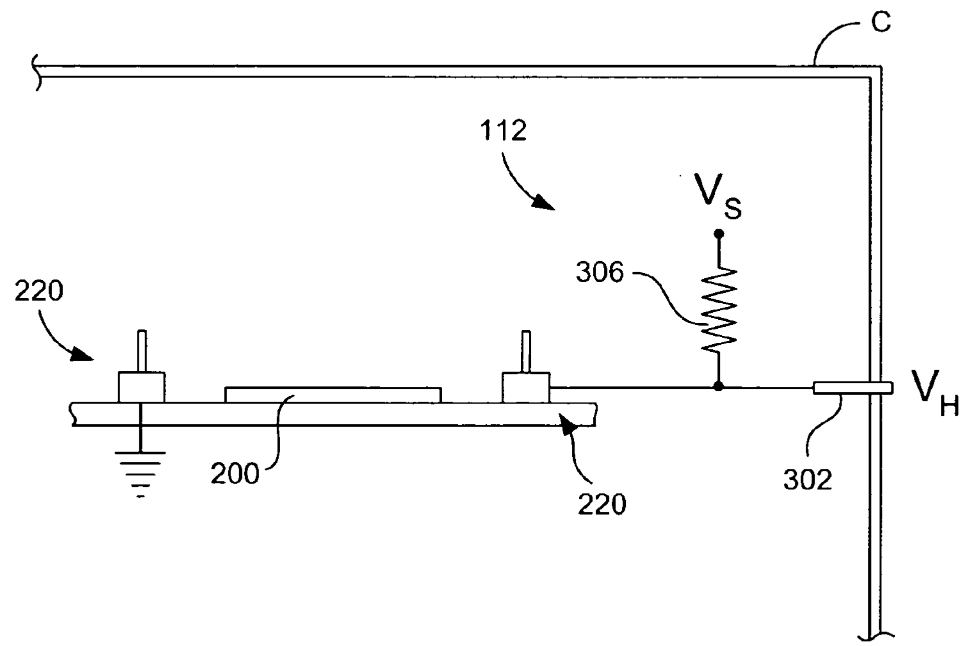
FIG. 5 illustrates an embodiment of detection of the absence of a heat sink using the embodiments of FIGS. 2–3.

FIGS. 4 and 5 illustrate operation of the example system illustrated by the embodiments of FIGS. 2–3. In particular, FIG. 4 depicts detection of the presence of a heat sink in a computing device, C, and FIG. 5 depicts detection of the absence of a heat sink in the computing device, C. Beginning with the scenario depicted in FIG. 4, the heat sink 208 is securely held to the heat-producing component 200 with the heat sink retainer clip 214. Accordingly, the heat sink detection circuit 112 is in electrical communication with ground via the heat sink retainer clip 214 and the mounting posts 220. Specifically, current can flow from the voltage source, $V_s$, to a first mounting post 220, through the heat sink retainer clip 214, and to another mounting post that is connected to ground (the left-most clip 220 in FIG. 4). Because of the connection to ground and the associated current flow, the voltage that is observed at the pin 302 is relatively low. By way of example, this voltage will be less than approximately 1 V. Therefore a relatively low voltage, $V_L$, can be measured which may be treated as a first logic value that identifies the presence of the heat sink.

In the scenario depicted in FIG. 5, no heat sink retaining clip is present, for instance due to a manufacturing error and, as a result, no heat sink is present. Because of the absence of the retaining clip, the mounting post 220 that is connected to the heat sink detection circuit 112 is not in electrical communication with the mounting post that is connected to ground. Therefore, the current flow described above in relation to FIG. 4 does not occur and, accordingly, the voltage observed at the pin 302 is relatively high. That voltage is identified as $V_H$ in FIG. 5 and may be, for example, slightly less than $V_s$ (due to the presence of the resistor 306). $V_H$ may be treated as a second logic value that identifies the absence of the heat sink.

As indicated in each of FIGS. 4 and 5, the pin 302 of the heat sink detection circuit 112 may extend beyond the interior of the computer, C. As a result, the presence or absence of the heat sink 208 may be determined without the need to visually inspect the PCB to which the heat sink should be mounted and, therefore, without the need to remove the computer's outer housing. Accordingly, the presence or absence of the heat sink 208 can be determined at any time after manufacturing is completed, and even after the computer has been purchased by a consumer.

Figure 6:
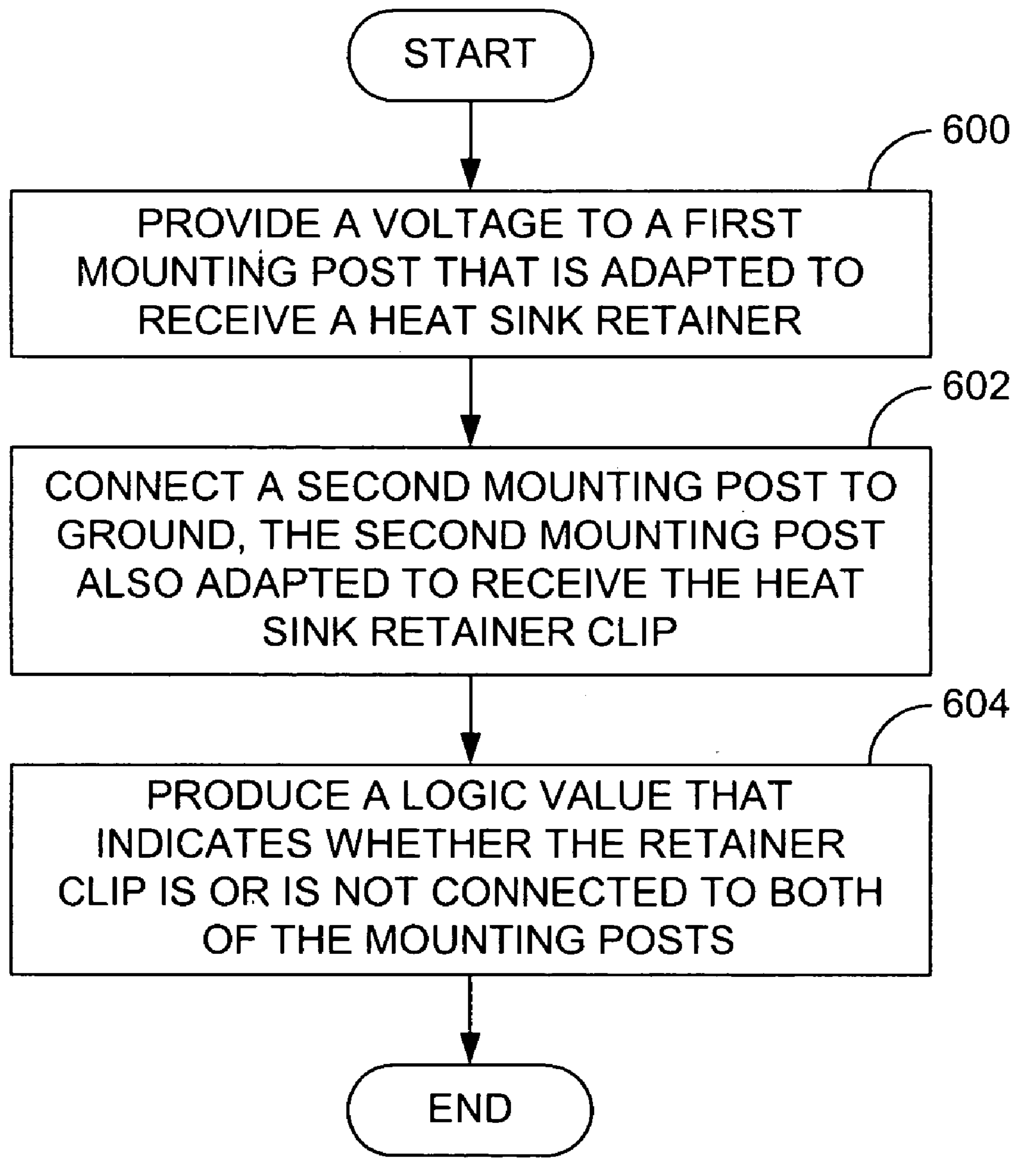
FIG. 6 is a flow diagram that summarizes an embodiment of a method for determining whether a heat sink is installed.

In view of the foregoing, a method for detecting the absence of a heat sink can be described as provided in the flow diagram of FIG. 6. As shown in FIG. 6, such a method comprises providing a voltage to a first mounting post that is adapted to receive a heat sink retainer clip (block 600), connecting a second mounting post to ground, the second mounting post also being adapted to receive the heat sink retainer clip (block 602), and producing a logic value that indicates whether the retainer clip is or is not connected to both of the mounting posts (block 604).

What is claimed is:

1. A system for determining whether a heat sink is installed, the system comprising:

an electrically-conductive heat sink retainer clip that is adapted to maintain contact between a heat sink and a heat-producing component, the retainer clip further being adapted to electrically connect to ground; and a heat sink detection circuit adapted to provide voltage to the retainer clip, the heat sink detection circuit being configured to provide a logic value that indicates one of presence or absence of a heat sink, wherein the logic value is provided to a pin that is adapted to be accessible beyond an interior of a computing device in which the detection circuit is provided such that presence or absence of the heat sink can be detected by reading the logic value from the pin from an exterior of the computing device.

2. The system of claim 1, wherein the heat sink retainer clip is composed of a metal.

3. The system of claim 2, wherein the heat sink retainer clip is a spring.

4. The system of claim 1, wherein the heat sink retainer clip is adapted to be held in place by electrically-conductive mounting posts.

5. The system of claim 1, wherein the heat sink detection circuit is adapted to connect to a voltage source to provide voltage to the heat sink retainer clip.

6. The system of claim 1, wherein the heat sink detection circuit comprises a resistor that is in electrical communication with the voltage source.

7. The system of claim 1, wherein the heat sink detection circuit is adapted to provide a first logic value when the heat sink is installed and a second logic value when the heat sink is not installed.

8. The system of claim 7, wherein the first logic value is a relatively-low voltage and the second logic value is a relatively-high voltage.

9. A printed circuit assembly, comprising:

a printed circuit board;

a heat-producing component mounted to the printed circuit board;

a heat sink in contact with the heat-producing component;

an electrically-conductive heat sink retaining clip that holds the heat sink against the heat-producing component, the retaining clip being electrically connected to ground; and a heat sink detection circuit electrically connected to the heat sink retaining clip, the detection circuit being adapted to provide voltage to the retaining clip and produce a logic value that indicates presence of the heat sink, wherein the logic value is provided to a pin that is adapted to be accessible beyond an interior of a computing device in which the detection circuit is provided such that presence or absence of the heat sink can be detected by reading the logic value from the pin from an exterior of the computing device.

10. The printed circuit assembly of claim 9, wherein the heat-producing component comprises a microchip.

11. The printed circuit assembly of claim 9, wherein the heat sink retaining clip is composed of a metal.

12. The printed circuit assembly of claim 9, wherein the heat sink retaining clip is a spring.

13. The printed circuit assembly of claim 9, further comprising two electrically-conductive mounting posts to which the heat sink retainer clip connects, one mounting post being connected to ground and the other mounting post being connected to the heat sink detection circuit.

14. The printed circuit assembly of claim 9, wherein the heat sink detection circuit comprises a resistor.

15. A system for determining whether a heat sink is installed, the system comprising:

electrically-conductive means for maintaining a heat sink in contact with a heat-producing component; and means for detecting presence of a heat sink, the means for detecting being adapted to provide voltage to the means for maintaining, the means for detecting being configured to produce a first logic value that indicates presence of the heat sink and a second logic value that indicates absence of the heat sink, wherein the logic value is provided to a pin that is adapted to be accessible beyond an interior of a computing device in which the detection circuit is provided such that presence or absence of the heat sink can be detected by reading the logic value from the pin from an exterior of the computing device.

16. The system of claim 15, wherein means for maintaining comprise a metal heat sink retainer clip that is adapted to connect to electrically conductive mounting posts.

17. The system of claim 15, wherein the first logic value is a relatively-low voltage that results from presence of the means for maintaining and its connection to ground, and wherein the second logic value is a relatively-high voltage that results from absence of the means for maintaining.

18. A computing device, comprising:

a circuit assembly that includes a circuit board, a heat-producing component mounted to the circuit board, a heat sink in contact with the heat-producing component, an electrically-conductive heat sink retaining clip that holds the heat sink against the heat-producing component, the retaining clip being electrically connected to ground, and a heat sink detection circuit electrically connected to the heat sink retaining clip, the detection circuit being adapted to provide voltage to the retaining clip and produce a logic value that indicates presence of the heat sink, wherein the logic value is provided to a pin that is accessible beyond an interior of the computing device such that presence or absence of the heat sink can be detected by reading the logic value from the pin from an exterior of the computing device.

19. The device of claim 18, wherein the heat-producing component comprises a microchip.

20. The device of claim 18, wherein the heat sink retaining clip is composed of a metal.

21. The device of claim 18, further comprising two electrically-conductive mounting posts to which the heat sink retainer clip connects, one mounting post being connected to ground and the other mounting post being connected to the heat sink detection circuit.

22. The device of claim 18, wherein the heat sink detection circuit is configured to provide a first logic value that indicates that the heat sink retainer clip is correctly installed and a second logic value that indicates that the heat sink retainer clip is not correctly installed.

23. A method for determining whether a heat sink is installed, the method comprising:

providing a voltage to a first mounting post that is adapted to receive a heat sink retainer clip that is adapted to hold a heat sink against a heat-producing element;

connecting a second mounting post to ground, the second mounting post also being adapted to receive the heat sink retainer clip; and producing a logic value that indicates whether the retainer clip is or is not connected to both of the mounting posts to a pin that is accessible beyond an interior of a computing device in which the detection circuit is provided such that presence or absence of the heat sink can be detected by reading the logic value from the pin from an exterior of the computing device.

24. The method of claim 23, wherein providing a voltage comprises providing a voltage from a computing device power source with a heat sink detecting circuit.

25. The method of claim 24 wherein the logic value is a relatively-low voltage when the heat sink is installed and a relatively-high voltage when the heat sink is not installed.

* * * * *